(12) United States Patent
Kim et al.

(10) Patent No.: US 7,529,119 B2
(45) Date of Patent: May 5, 2009

(54) MAGNETIC LOGIC DEVICE AND METHODS OF MANUFACTURING AND OPERATING THE SAME

(75) Inventors: Sung-dong Kim, Seongnam-si (KR); Eun-sik Kim, Seoul (KR); Ju-hwan Jung, Seoul (KR); Hyoung-soo Ko, Seoul (KR); Dong-ki Min, Seoul (KR); Hong-sik Park, Seoul (KR); Seung-bum Hong, Seongnam-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 475 days.

(21) Appl. No.: 11/320,898

(22) Filed: Dec. 30, 2005

(65) Prior Publication Data
US 2006/0145806 A1 Jul. 6, 2006

(30) Foreign Application Priority Data
Dec. 30, 2004 (KR) ............. 10-2004-0117010

(51) Int. Cl.
G11C 11/00 (2006.01)
(52) U.S. Cl. ................. 365/158; 365/171; 365/173
(58) Field of Classification Search ........ 365/159, 365/171, 173, 158
See application file for complete search history.

(56) References Cited

U.S. PATENT DOCUMENTS

| 6,034,887 | A | 3/2000 | Gupta et al. | |
|---|---|---|---|---|
| 6,312,840 | B1 * | 11/2001 | Kumagai et al. | ......... 428/811.1 |
| 6,826,077 | B2 * | 11/2004 | Smith et al. | ............ 365/158 |
| 6,937,508 | B1 * | 8/2005 | Hakkarainen | .......... 365/171 |
| 7,283,333 | B2 * | 10/2007 | Gill | .................... 360/324.1 |
| 7,310,265 | B2 * | 12/2007 | Zheng et al. | ............ 365/158 |

FOREIGN PATENT DOCUMENTS

| CN | 1244017 A | 2/2000 |
|---|---|---|
| CN | 1448946 A | 10/2003 |
| EP | 1349172 A1 | 10/2003 |
| EP | 1471643 A1 | 10/2004 |
| JP | 2004-179219 A | 6/2004 |
| WO | 2004/051853 A2 | 6/2004 |

OTHER PUBLICATIONS

Wang J. et al., "Programmable spintronics logic device based on a magnetic tunnel junction element", 49th Annual Conference on Magnetism and Magnetic Materials, Journal of Applied Physics, May 6, 2005, pp. 10D509/1-3, vol. 97, No. 10, Jacksonville, FL, USA.

* cited by examiner

*Primary Examiner*—Pho M. Luu
(74) *Attorney, Agent, or Firm*—Sughrue Mion, PLLC

(57) ABSTRACT

A magnetic logic device (MLD) and methods of manufacturing and operating an MLD are provided. The MLD includes: a first interconnection; a lower magnetic layer formed on the first interconnection, the lower magnetic layer having a magnetization direction fixed in a predetermined direction; a non-magnetic layer formed on the lower magnetic layer; an upper magnetic layer formed on the non-magnetic layer, the upper magnetic layer having a magnetization direction parallel or anti-parallel to the magnetization direction of the lower magnetic layer; and a second interconnection formed on the upper magnetic layer. A first current source is disposed between one end of the first interconnection and one end of the second interconnection and a second current source is disposed between the other end of the first interconnection and the other end of the second interconnection.

26 Claims, 14 Drawing Sheets

| STATE OF MTJ CELL BEFORE APPLYING CURRENT | DIRECTION OF APPLIED CURRENT | | STATE OF MTJ CELL AFTER APPLYING CURRENT |
|---|---|---|---|
| AP | 1 | 1 | P |
| AP | 1 | 0 | AP |
| AP | 0 | 1 | AP |
| AP | 0 | 0 | AP |

| STATE OF MTJ CELL BEFORE APPLYING CURRENT | DIRECTION OF APPLIED CURRENT | | STATE OF MTJ CELL AFTER APPLYING CURRENT |
|---|---|---|---|
| P | 1 | 1 | P |
| P | 1 | 0 | P |
| P | 0 | 1 | P |
| P | 0 | 0 | AP |

MAGNETIC LOGIC DEVICE AND METHODS OF MANUFACTURING AND OPERATING THE SAME

CROSS-REFERENCE TO RELATED PATENT APPLICATION

This application claims priority from Korean Patent Application No. 10-2004-0117010, filed on Dec. 30, 2004 in the Korean Intellectual Property Office, the disclosure of which is incorporated herein in its entirety by reference.

BACKGROUND OF THE INVENTION

1. Field of the Invention

The present invention relates to a semiconductor device, and more particularly, to a magnetic logic device and methods of manufacturing and operating the same.

2. Description of the Related Art

Conventional logic devices, such as AND gates, OR gates, etc., consist of metal oxide semiconductor (MOS) transistors. Accordingly, the type of a conventional logic device is determined according to the structure of its MOS transistors. In addition, the determined type of the conventional logic device cannot be changed. For example, a conventional logic device initially manufactured as an AND gate can only be used as an AND gate and cannot be used as an OR gate.

SUMMARY OF THE INVENTION

The present invention provides a magnetic logic device (MLD) capable of selectively changing its function.

The present invention also provides a method of manufacturing the MLD.

The present invention also provides a method of operating the MLD.

According to an aspect of the present invention, there is provided an MLD including: a lower magnetic layer formed on a first interconnection, the lower magnetic layer having a magnetization direction that is fixed in a predetermined direction; a non-magnetic layer formed on the lower magnetic layer; an upper magnetic layer formed on the non-magnetic layer, the upper magnetic layer having a magnetization direction that is parallel or anti-parallel to the magnetization direction of the lower magnetic layer; and a second interconnection formed on the upper magnetic layer.

A first current source may be connected to a first end of the first interconnection and a first end of the second interconnection and a second current source may be connected to a second end of the first interconnection and a second end of the second interconnection.

The lower magnetic layer may include a plurality of magnetic layers.

According to another aspect of the present invention, there is provided an MLD including: a first interconnection; a lower magnetic layer formed on the first interconnection; a non-magnetic layer formed on the lower magnetic layer; an upper magnetic layer formed on the non-magnetic layer, the upper magnetic layer having a magnetization direction that is fixed in a predetermined direction; and a second interconnection formed on the upper magnetic layer, a magnetization direction of the lower magnetic layer being parallel or anti-parallel to the magnetization direction of the upper magnetic layer.

A first current source may be connected to a first end of the first interconnection and a first end of the second interconnection and a second current source may be connected to a second end of the first interconnection and a second end of the second interconnection. The upper magnetic layer may include a plurality of magnetic layers.

The MLD may further include a capping layer between the upper magnetic layer and the second interconnection.

The non-magnetic layer may include one of a tunneling layer and a non-magnetic metal layer.

According to a another aspect of the present invention, there is provided a method of manufacturing an MLD including: forming a lower magnetic layer on a first interconnection, the lower magnetic layer having a magnetization direction that is fixed in a predetermined direction; forming a non-magnetic layer on the lower magnetic layer and an upper magnetic layer on the non-magnetic layer; forming a second interconnection on the upper magnetic layer that is formed on the non-magnetic layer; and aligning a magnetization direction of the upper magnetic layer such that the magnetization direction of the upper magnetic layer is parallel or anti-parallel to the magnetization direction of the lower magnetic layer.

A first end of the first interconnection and a first end of the second interconnection may be connected to a first current source and a second end of the first interconnection and a second end of the second interconnection may be connected to a second current source.

The aligning the magnetization direction of the upper magnetic layer may further comprise applying at least a current of $Ic/2$ to the first end of the first interconnection from the first current source and simultaneously applying at least a current of $Ic/2$ to the second end of the first interconnection from the second current source, such that the magnetization direction of the upper magnetic layer becomes parallel to the magnetization direction of the lower magnetic layer.

Alternatively, the aligning the magnetization direction of the upper magnetic layer may further comprise applying at least a current of $Ic/2$ to the first end of the second interconnection from the first current source and simultaneously applying at least a current of $Ic/2$ to the second end of the second interconnection from the second current source, such that the magnetization direction of the upper magnetic layer becomes anti-parallel to the magnetization direction of the lower magnetic layer.

Furthermore, the aligning the magnetization direction of the upper magnetic layer may further comprise applying a magnetic field of a predetermined intensity to the upper magnetic layer, such that the magnetization direction of the upper magnetic layer becomes parallel or anti-parallel to the magnetization direction of the lower magnetic layer.

According to a another aspect of the present invention, there is provided a method of manufacturing an MLD, the method including: forming a lower magnetic layer and a non-magnetic layer sequentially on a first interconnection; forming an upper magnetic layer on the non-magnetic layer, the upper magnetic layer having a magnetization direction fixed in a predetermined direction; forming a second interconnection on the upper magnetic layer; and aligning a magnetization direction of the lower magnetic layer to be parallel or to be anti-parallel to the magnetization direction of the upper magnetic layer.

A first end of the first interconnection and a first end of the second interconnection may be connected to a first current source and a second end of the first interconnection and a second end of the second interconnection may be connected to a second current source.

The aligning the magnetization direction of the lower magnetic layer may further comprise applying at least a current of $Ic/2$ to the first end of the first interconnection from the first current source and simultaneously applying at least a current of Ic/2 to the second end of the first interconnection from the second current source, such that the magnetization direction of the lower magnetic layer becomes anti-parallel to the magnetization direction of the upper magnetic layer.

Furthermore, the aligning the magnetization direction of the lower magnetic layer may further comprise applying at least a current of Ic/2 to the first end of the second interconnection from the first current source and simultaneously applying at least a current of Ic/2 to the second end of the second interconnection from the second current source, such that the magnetization direction of the lower magnetic layer becomes parallel to that of the upper magnetic layer. Herein, Ic is a critical current that is required to reverse the magnetization direction of the lower magnetic layer.

Alternatively, the aligning the magnetization direction of the lower magnetic layer may further comprise applying a magnetic field of a predetermined intensity to the lower magnetic layer, such that the magnetization direction of the lower magnetic layer becomes parallel or anti-parallel to the magnetization direction of the upper magnetic layer.

The non-magnetic layer may be formed with one of a tunneling layer and a non-magnetic metal layer.

According to a another aspect of the present invention, there is provided a method of operating an MLD including applying at least a current of Ic/2 to two terminals selected among a first to a fourth terminals, wherein a first end and a second end of a first interconnection correspond to the first terminal and the second terminal, respectively, and a first end and a second end of a second interconnection correspond to the third terminal and the fourth terminal respectively, in which the MLD includes the first interconnection, a lower magnetic layer formed on the first interconnection, the lower magnetic layer having a magnetization direction that is fixed in a predetermined direction, a non-magnetic layer formed on the lower magnetic layer, an upper magnetic layer formed on the non-magnetic layer, the upper magnetic layer having a magnetization direction parallel or anti-parallel to the magnetization direction of the lower magnetic layer, and the second interconnection formed on the upper magnetic layer.

According to a another aspect of the present invention, there is provided a method of operating an MLD including applying at least a current of Ic/2 to two terminals selected among a first to a fourth terminals, wherein a first end and a second end of a first interconnection correspond to the first terminal and the second terminal, respectively, and a first end and a second end of the second interconnection correspond to the third terminal and the fourth terminal respectively, in which the MLD includes a first interconnection, a lower magnetic layer, a non-magnetic layer and an upper magnetic layer sequentially formed on the first interconnection and a second interconnection formed on the upper magnetic layer, wherein a magnetization direction of the lower magnetic layer is parallel or anti-parallel to a magnetization direction of the upper magnetic layer fixed in a predetermined direction.

A current Ic may be a critical current that is required to reverse the magnetization direction of the lower magnetic layer. The non-magnetic layer may include one of a tunneling layer and a non-magnetic metal layer.

The MLD of the present invention may be used as an AND gate or an OR gate by simply adjusting the magnetization direction of the upper magnetic layer of a magnetic tunnel junction (MTJ) cell. Therefore, the MLD may be selectively programmed according to the intended use thereof. In addition, the MLD has a simple structure and it can be easily and simply manufactured. Furthermore, since the magnetization direction of the upper magnetic layer is not controlled by the magnetic field but by the spin-polarized current, it is possible to accurately control the magnetization direction of the upper magnetic layer by means of controlling the current applied to the MTJ cell. Moreover, the logic device of the present invention can be implemented into only one cell, to thereby obtain a highly integrated device.

BRIEF DESCRIPTION OF THE DRAWINGS

The above and other aspects of the present invention will become more apparent by describing in detail exemplary embodiments thereof with reference to the attached drawings in which:

FIGS. 22, 23A, 24A and 26 are cross-sectional views illustrating a method of manufacturing an MLD shown in FIG. 1 when used as an OR gate.

DETAILED DESCRIPTION OF THE EXEMPLARY EMBODIMENTS OF THE INVENTION

Figure 1:
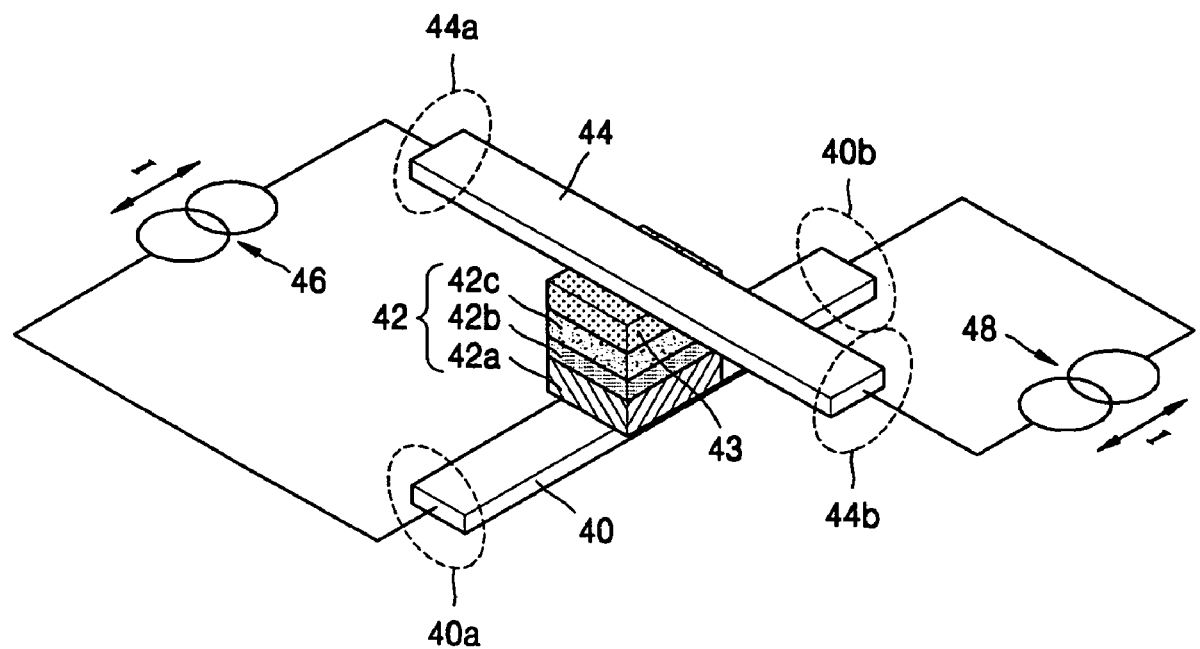
FIG. 1 is a three-dimensional schematic view of a magnetic logic device (MLD) according to an exemplary embodiment of the present invention.

A magnetic logic device (MLD) and methods of manufacturing and operating the same according to exemplary embodiments of the present invention will now be described more fully with reference to the accompanying drawings. In the drawings, the thicknesses of layers and regions are exaggerated for clarity.

A magnetization direction of a magnetic material may be reversed by applying a magnetic field of a predetermined intensity to the magnetic material or by directly applying a spin polarization current of a critical value to the magnetic material.

An MLD according to exemplary embodiments of the present invention is realized by the direct application of a spin polarization current to the magnetic material.

FIG. 1 is a three-dimensional schematic view illustrating an MLD according to an exemplary embodiment of the present invention.

Referring to FIG. 1, an MLD according to an exemplary embodiment of the present invention includes a first interconnection 40. A magnetic tunnel junction (MTJ) cell 42 is formed on a predetermined region of the first interconnection. The MTJ cell 42 may be replaced by another magnetic element which plays the same role as the MTJ cell 42. The MTJ cell 42 may be include a lower magnetic layer 42a, a non-magnetic layer 42b and an upper magnetic layer 42c which are sequentially formed on the first interconnection 40. A magnetization direction of the lower magnetic layer 42a is fixed in a predetermined direction. The lower magnetic layer 42a may be a multi-layer in which a pinning layer and a synthetic anti-ferromagnetic (SAF) layer are stacked sequentially. The non-magnetic layer 42b may be a tunneling layer with a predetermined thickness so that electrons flowing into the lower magnetic layer 42a or the upper magnetic layer 42c can penetrate therethrough by a tunneling effect. For example, the non-magnetic layer 42b may be an aluminum oxide (AlOx) layer. In addition, the non-magnetic layer 42b may be a non-magnetic metal layer which constitutes a giant magnetoresistance (GMR) with the lower magnetic layer 42a and the upper magnetic layer 42c. The upper magnetic layer 42c has such a characteristic that a magnetization direction may be easily changed according to a magnetic field of a predetermined intensity that is applied from the exterior, or a predetermined spin polarization current which penetrates the upper magnetic layer 42c.

In case that the magnetization direction of the upper magnetic layer 42c is parallel to that of the lower magnetic layer 42a, a resistance of the MTJ cell 42 becomes low. To the contrary, if the magnetization direction of the upper magnetic layer 42c is anti-parallel to that of the lower magnetic layer 42a, a resistance of the MTJ cell 42 becomes high. Herein, there may be formed a protection capping layer (43) additionally on the upper magnetic layer 42c.

A second interconnection 44 is disposed on the upper magnetic layer 42c of the MTJ cell 42. The second interconnection 44 is extended with a predetermined length in a direction perpendicular to the first interconnection 40. Meanwhile, a first current source 46 is disposed between one end 40a of the first interconnection 40 and one end 44a of the second interconnection 44. The first current source 46 is connected to both one end 40a of the first interconnection 40 and one end 44a of the second interconnection 44. The first current source 46 supplies current which flows through the second interconnection 44, the MTJ cell 42 and the first interconnection 40 in sequence or current which flows in a reverse direction through the first interconnection 40, the MJT cell 42 and the second interconnection 40. A second current source 48 is provided between the other end 40b of the first interconnection 40 and the other end 44b of the second interconnection 44. The second current source 48 is connected to both the other end 40b of the first interconnection 40 and the other end 44b of the second interconnection 44. The second current source 48 supplies a current which flows through the second interconnection 44, the MTJ cell 42, and the first interconnection 40 in sequence. However, the current can flow in a reverse direction through the first interconnection 40, the MJT cell 42 and the second interconnection 44.

Figure 2:
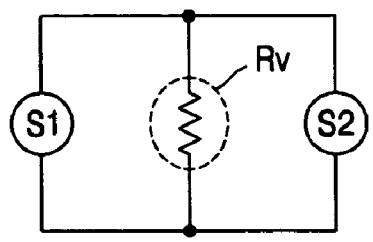
FIG. 2 is an equivalent circuit diagram of the MLD shown in FIG. 1.

FIG. 2 is an equivalent circuit diagram illustrating the MLD of FIG. 1 according to an exemplary embodiment of the present invention.

In FIG. 2, S1 and S2 represent the first current source 46 and the second current source 48, respectively. Furthermore, a variable resistor Rv corresponds to the MTJ cell 42.

FIGS. 3 through 6 are cross-sectional views illustrating a variation of a magnetization direction of the MTJ cell 42 according to a spin polarization current applied to the MTJ cell 42 of the MLD shown in FIG. 1.

Referring to FIGS. 3 through 6, a first current I1 denotes a spin polarization current that flows through the lower magnetic layer 42a, the non-magnetic layer 42b and the upper magnetic layer 42c sequentially. A second current I2 is a spin polarization current that flows through the upper magnetic layer 42c, the non-magnetic layer 42b and the lower magnetic layer 42a in sequence. Herein, a spin polarization direction of the first current I1 is identical to the magnetization direction of the lower magnetic layer 42a. Likewise, a spin polarization direction of the second current I2 is identical to the magnetization direction of the upper magnetic layer 42c.

Figure 3:
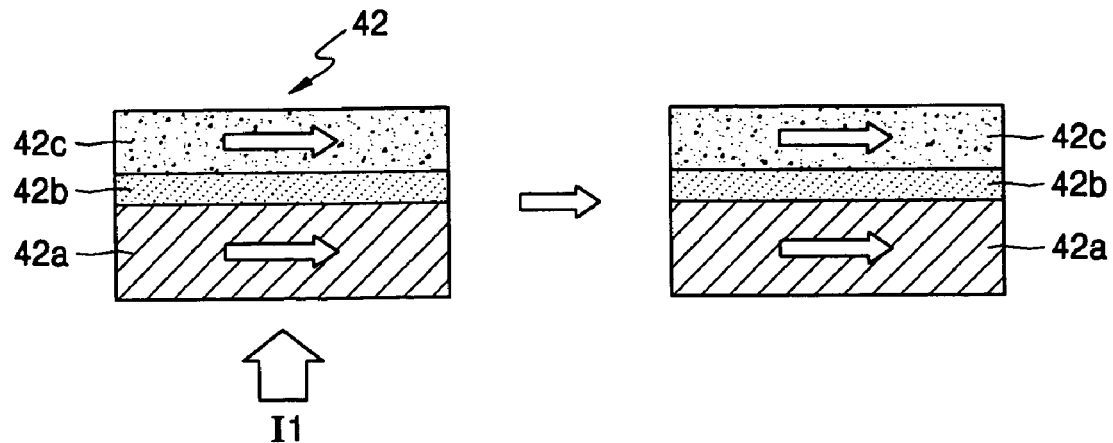
FIGS. 3 through 6 are cross-sectional views illustrating variations in magnetization direction of a free magnetic layer of a magnetic tunnel junction (MTJ) cell of the MLD shown in FIG. 1 according to a direction of a current applied to the MLD shown in FIG. 1.

Therefore, as shown in FIG. 3, when the first current I1 with a predetermined intensity, e.g., $10^7$ A/cm$^2$ or above, is applied to the MTJ cell 42 under the condition that the magnetization direction of the upper magnetic layer 42c of the MTJ cell 42 is parallel to that of the lower magnetic layer 42a, a polarization state of the MTJ cell 42 is the same as a polarization state before the first current I1 is applied as shown in the right-side drawing of FIG. 3 because the spin polarization direction of the first current I1 is also parallel to the upper and the lower magnetic layers 42c and 42a.

Figure 4:
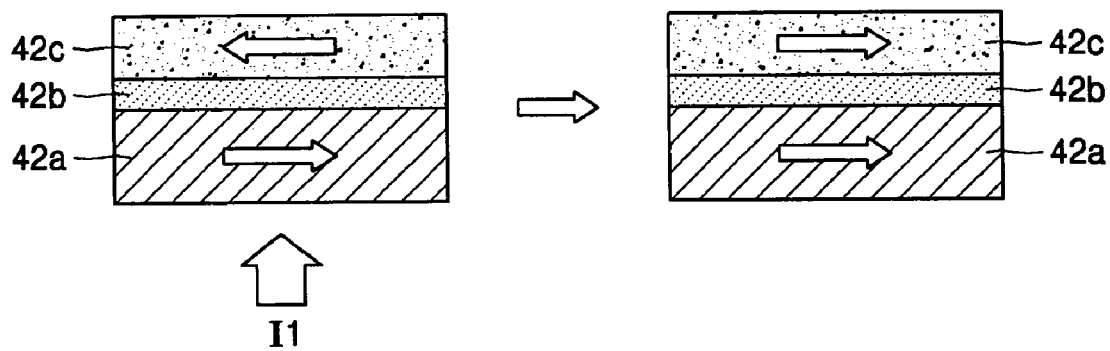

Meanwhile, referring to FIG. 4, when the first current I1 is applied to the MTJ cell 42 under the condition that the magnetization direction of the upper magnetic layer 42c is anti-parallel to that of the lower magnetic layer 42a, a magnetization direction of the upper magnetic layer 42c of the MTJ cell 42 is changed by the spin polarization of the first current I1 so that the magnetization direction of the upper magnetic layer 42c becomes parallel to the spin polarization direction of the first current I1. Therefore, the magnetization direction of the upper magnetic layer 42c becomes parallel to that of the lower magnetic layer 42a.

Hereby, provided that the first current I1 is applied to the MTJ cell 42, each magnetization direction of the upper and the lower magnetic layers 42c and 42a becomes parallel to that of the lower magnetic layer 42a despite an initial magnetization direction of the upper magnetic layer 42c of the MTJ cell 42.

Figure 5:
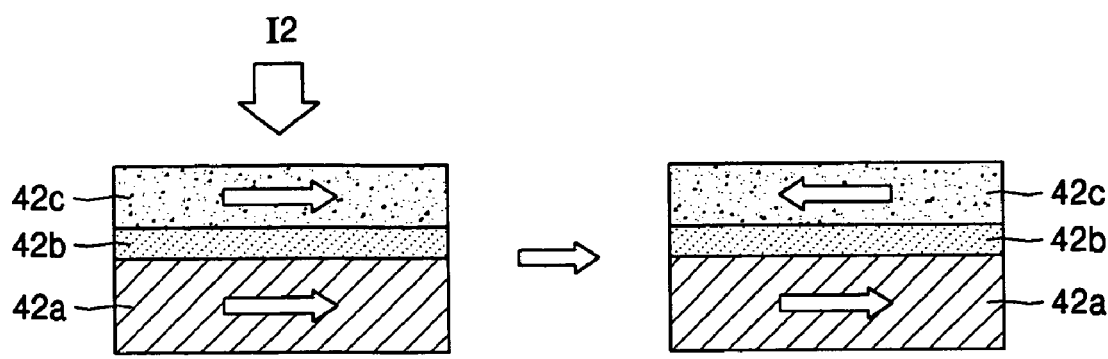

Referring to FIG. 5, when the second current I2 is applied to the MTJ cell 42 under the condition that the magnetization direction of the upper magnetic layer 42c is parallel to that of the lower magnetic layer 42a, the magnetization direction of the upper magnetic layer 42c changes, which is different from the result described in FIG. 3.

A mechanism for the magnetization direction of the upper magnetic layer 42c may be explained according to various principles, one of which will be set forth in detail as follows.

As aforementioned, the spin polarization direction of the first and the second current I1 and I2 is parallel to the lower magnetic layer 42a and the upper magnetic layer 42c, respectively. This description is correct when each of the currents I1 and I2 is considered as a whole. In fact, each of the currents I1 and I2 has components of which spin polarization directions are opposite to each other. That is, one component is a major component having spin polarization directions that are parallel to the magnetization directions of the lower and the upper magnetic layers 42a and 42c, and the other component is a minor component having spin polarization directions that are anti-parallel to the magnetization directions of the lower and the upper magnetic layers 42a and 42c.

As shown in FIG. 5, in case that the second current I2 is applied to the MTJ cell 42, the spin polarization direction of the major component is parallel to the magnetization direction of the upper magnetic layer 42c as well as that of the lower magnetic layer 42a, such that the major component just passes therethrough. Further, the spin polarization direction of the minor component of the second current I2 is opposite to the magnetization direction of the lower magnetic layer 42a so that the minor component of the second current I2 cannot pass through the lower magnetic layer 42a. As a result, the minor component is reflected from an interface between the non-magnetic layer 42b and the lower magnetic layer 42a into the upper magnetic layer 42c. Since the reflected minor component, i.e., the reflected electrons, has the spin polarization direction opposite to the magnetization direction of the upper magnetic layer 42c, the magnetization direction of the upper magnetic layer 42c becomes reversed so as to be parallel to the spin polarization direction of the reflected minor component. As a result, the magnetization direction of the upper magnetic layer 42c becomes anti-parallel to that of the lower magnetic layer 42a.

Figure 6:
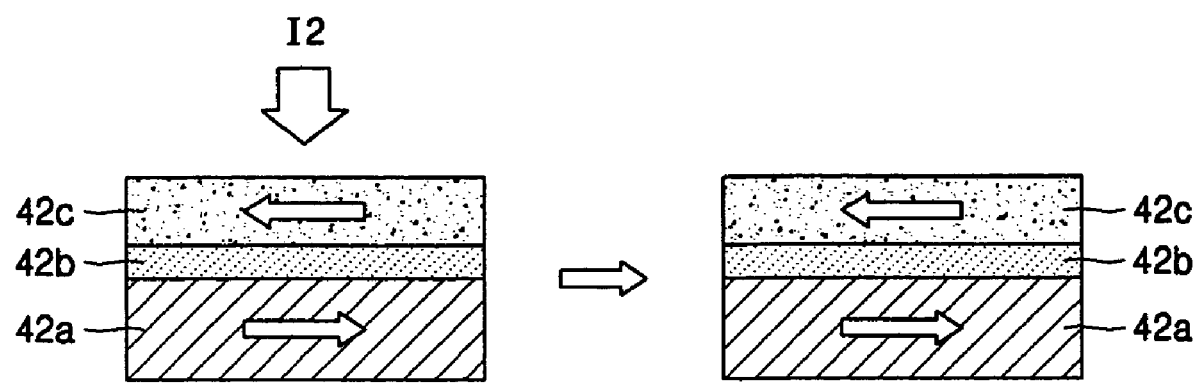

Referring to FIG. 6, if the second current I2 is applied to the MTJ cell 42 under the condition that the magnetization direction of the upper magnetic layer 42c is anti-parallel to that of the lower magnetic layer 42a, the minor component of the second current I2 just passes through the non-magnetic layer 42b and the lower magnetic layer 42c. Thus, the major component, which has a spin polarization direction that is anti-parallel to the lower magnetic layer 42a, is reflected from the interface between the non-magnetic layer 42b and the lower magnetic layer 42a to the upper magnetic layer 42c. However, since the reflected major component has the same polarization direction with that of the upper magnetic layer 42c, the magnetization direction of the upper magnetic layer 42c is not changed. That is, an initial polarization state where the magnetization direction of the upper magnetic layer 42c is anti-parallel to that of the lower magnetic layer 42a may remain intact whether the second current I2 is applied or not.

From the results of FIGS. 5 and 6, in case that the second current I2 is applied to the MTJ cell 42, the MTJ cell 42 has only one polarization state where the magnetization direction of the upper magnetic layer 42c is opposite to that of the lower magnetic layer 42a regardless of the initial polarization state of the MTJ cell 42. Thus the MTJ cell 42 remains in a high resistance state.

At this time, it is noted that each of the first and second currents I1 and I2 should be applied at more than a predetermined critical value Ic for reversing the magnetization direction of the upper magnetic layer 42c by using the spin polarization current.

In the MLD of the present invention as shown in FIG. 1, the first current I1 can be applied to the MTJ cell 42 by supplying a first terminal and a second terminal, which are connected to the lower magnetic layer 42a, with a spin polarization current corresponding to at least half of the critical value Ic. In addition, the second current I2 can be applied to the MTJ cell 42 by supplying a third terminal and a fourth terminal, which are connected to the upper magnetic layer 42c, with a spin polarization current corresponding to at least half of the critical value Ic. The first and the second terminals may be connected to the lower magnetic layer 42a as one body, as in the first interconnection 40 depicted in FIG. 1. Alternatively, the first and the second terminals may be formed separately so that each terminal may be separately connected to the lower magnetic layer 42a. Likewise, the third and the fourth terminals may be connected to the upper magnetic layer 42c as one body like the second interconnection 44 depicted in FIG. 1. Alternatively, the third and the fourth terminals may be formed separately.

The MLD of FIG. 1 may be used for various logic devices. First of all, an example will be presented when the MLD is used as an AND gate. The example shows how the MLD operates.

Figure 7:
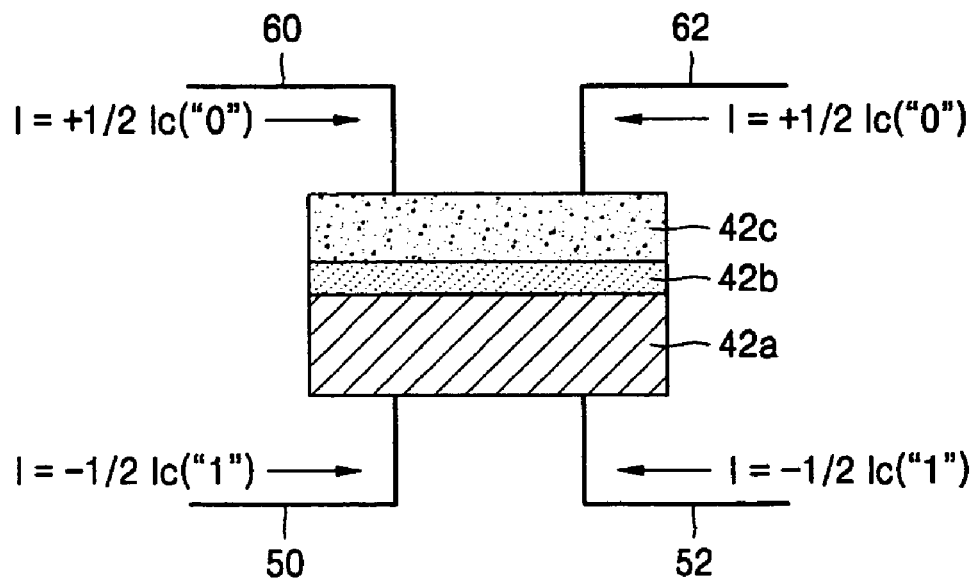
FIG. 7 is a cross-sectional view illustrating the connection between the MTJ cell and first through fourth terminals of the MLD shown in FIG. 1, in which reference characters indicating currents applied to the terminals and signals corresponding to the currents are shown.

FIG. 7 is a cross-sectional view illustrating an operational mechanism of the MLD of FIG. 1 according to an exemplary embodiment of the present invention.

In FIG. 7, it is noted that the first and the second terminals 50 and 52 correspond to one end 40a and other end 40b of the first interconnection 40 shown in FIG. 1, respectively, and the third and the fourth terminals 60 and 62 correspond to one end 44a and other end 44b of the second interconnection 44, respectively. When a current Ic/2 corresponding to half of the critical value Ic of the first current I1 is applied to the first and the second terminals 50 and 52, it is considered that a signal "1" is applied to each of the first and the second terminals 50 and 52. Likewise, when a current Ic/2 corresponding to half of the critical value Ic of the second current I2 is applied to the third and the fourth terminals 60 and 62, it is considered that a signal "0" is applied to each of the third and the fourth terminals 60 and 62. In order to differentiate the current applied to the first and the second terminals 50 and 52 from the current applied to the third and the fourth terminals 60 and 62, it is assumed that the current applied to the first and the second terminals 50 and 52 is represented as a negative one and the current applied to the third and the fourth terminals 60 and 62 be represented as a positive one. The same assumption applies when the MLD is used as an OR gate.

Figure 8:
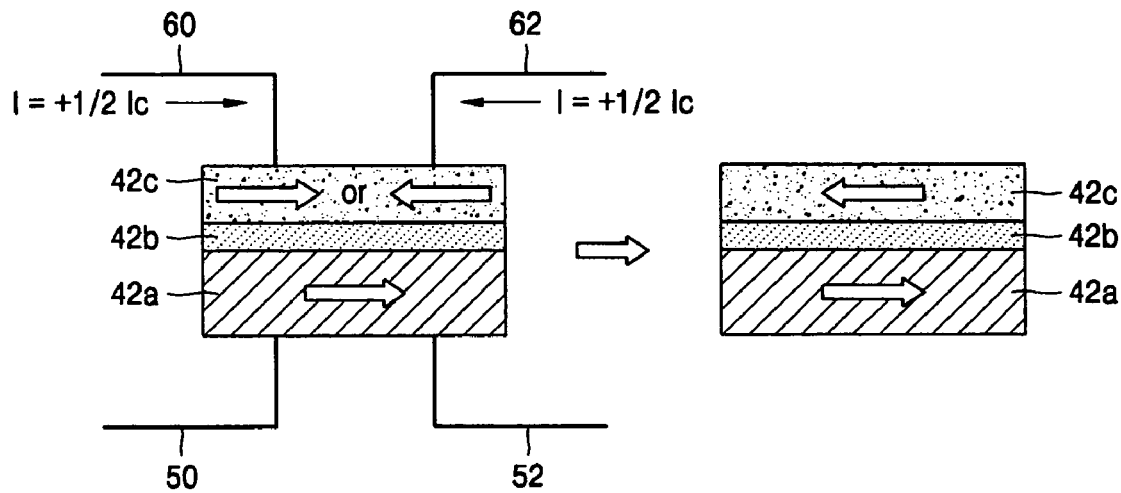
FIG. 8 is a cross-sectional view illustrating an initializing process for aligning a magnetization direction in an upper magnetic layer to be opposite to that in a lower magnetic layer in order to use the MLD of FIG. 1 as an AND gate.

In order to use the MLD as an AND gate, the magnetization direction of the upper magnetic layer 42c should be anti-parallel to that of the lower magnetic layer 42a. With the reference to FIGS. 5 and 6 described previously, a predetermined current (+Ic/2) corresponding to at least half of the critical value Ic is applied to the third and the fourth terminals 60 and 62 so that the current having at least the critical value Ic is applied to the MTJ cell 42. This operation is depicted in FIG. 8.

FIGS. 9 through 12 are cross-sectional views illustrating an operation of the MLD used as an AND gate according to an exemplary embodiment of the present invention.

Figure 9:
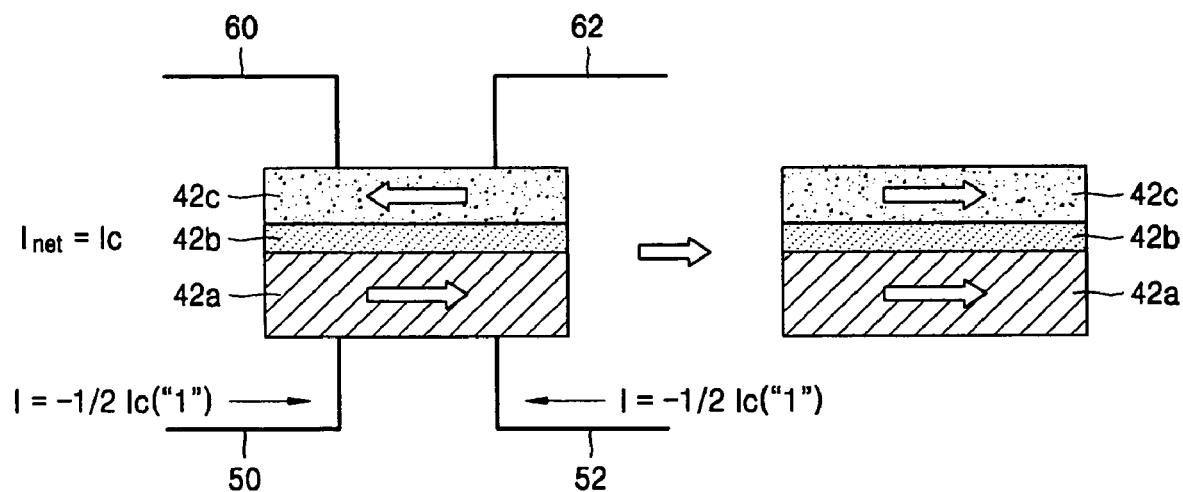
FIGS. 9 through 12 are cross-sectional views illustrating operations of the MLD of FIG. 1 when used as an AND gate.

Referring to FIG. 9, a predetermined spin polarization current (−Ic/2) is applied to the first terminal 50 of the MTJ cell 42 in which the magnetization direction of the upper magnetic layer 42c is preset to be opposite to that of the lower magnetic layer 42a. Simultaneously, a predetermined spin polarization current (−Ic/2) is applied to the first and the second terminal 50 and 52. That is, the signal "1" is applied to each of the first and the second terminals 50 and 52. Hereby, a net current Inet applied to the MTJ cell 42 becomes the first current I1 that incorporates therein spin-polarized electrons capable of reversing the magnetization direction of the upper magnetic layer 42c. As a result of the first current I1, the magnetization direction of the upper magnetic layer 42c becomes parallel to that of the lower magnetic layer 42a. The result of FIG. 9 means that if the signal "1" is applied to each of the first and the second terminals 50 and 52 of the MTJ cell 42 under the condition that the magnetization direction of the upper magnetic layer 42c is anti-parallel to that of the lower magnetic layer 42a, the magnetization direction of the upper magnetic layer 43c is reversed and becomes parallel to that of the lower magnetic layer 43a.

Figure 10:
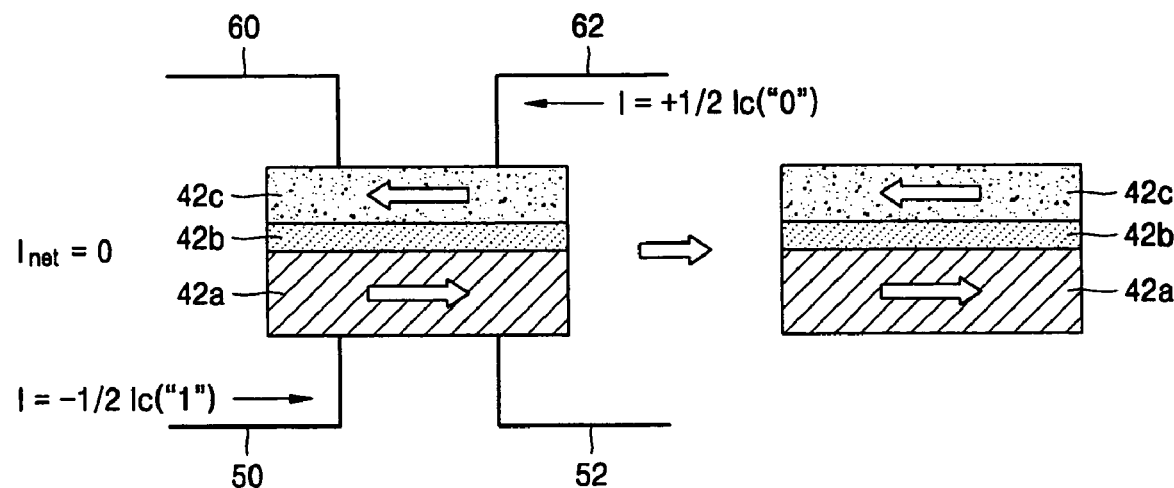

Referring to FIG. 10, a predetermined spin polarization current (−Ic/2) (i.e., a signal "1") is applied to the first terminal 50 of the MTJ cell 42 in which the magnetization direction of the upper magnetic layer 42c is anti-parallel to that of the lower magnetic layer 42a. Furthermore, in case that a predetermined spin polarization current (+Ic/2) (i.e., a signal "0") is applied to the fourth terminal 62, a net spin polarization current Inet becomes zero. That is, since the net spin polarization current Inet is smaller than the critical value Ic, the MTJ cell maintains the initial polarization state.

Figure 11:
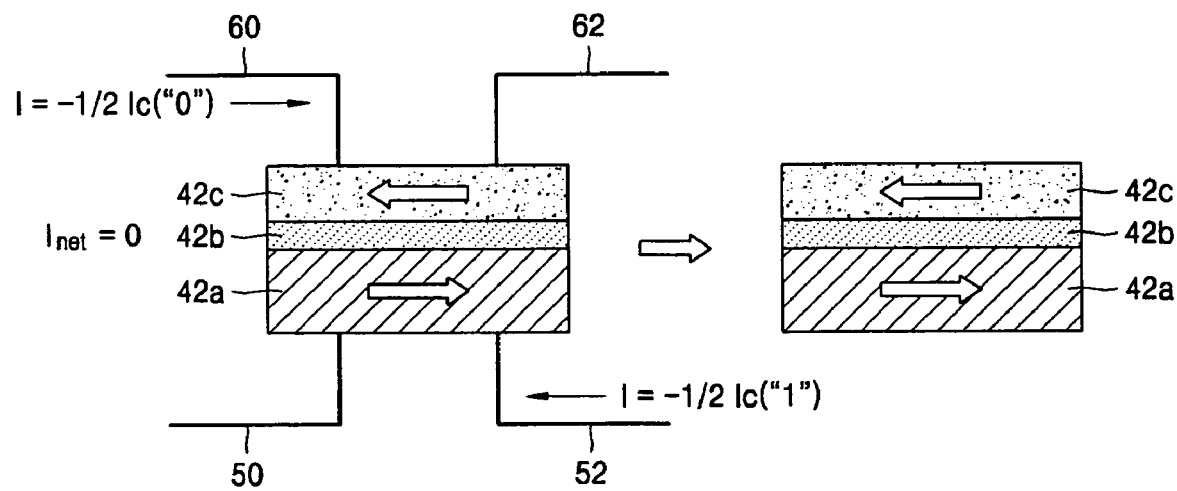

Referring to FIG. 11, a predetermined spin polarization current (−Ic/2), i.e., a signal "1", is applied to the second terminal 52 of the MTJ cell 42 in which the magnetization direction of the upper magnetic layer 42c is anti-parallel to that of the lower magnetic layer 42a. Furthermore, in case that a predetermined spin polarization current (+Ic/2), i.e., a signal "0", is applied to the third terminal 60, a net spin polarization current Inet becomes zero. That is, since the net spin polarization current Inet is smaller than the critical value Ic, the upper magnetic layer 42c of the MTJ cell is not reversed so that the upper magnetic layer 42c maintains its initial polarization state.

Figures 12, 13:
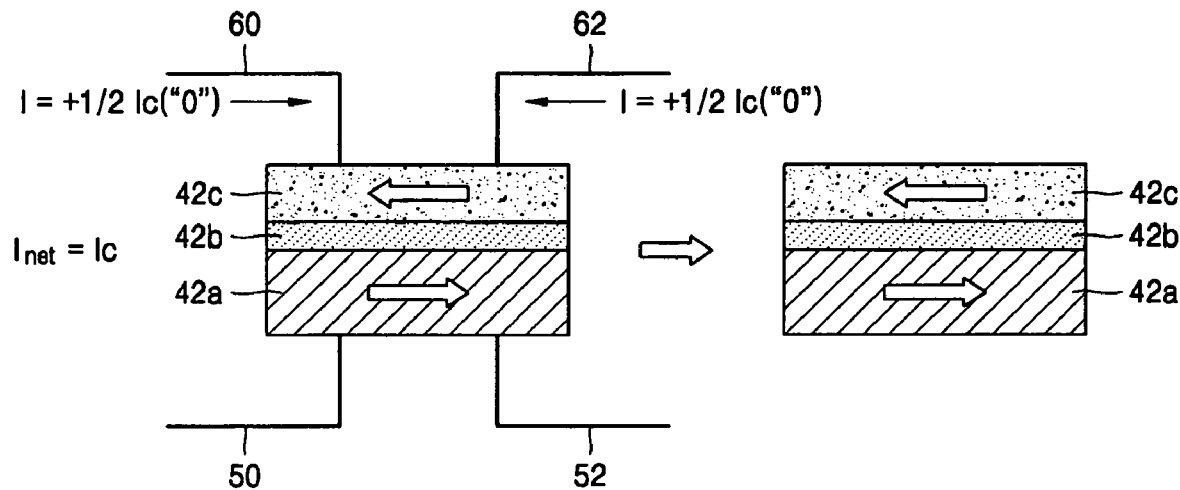
FIG. 13 is a table of the operations illustrated in FIG. 9 through FIG. 12 when the MLD of FIG. 1 is used as an AND gate.

Referring to FIG. 12, a predetermined spin polarization current (+Ic/2) (i.e., a signal "0") is applied to both the third terminal 60 and the fourth terminal 62 of the MTJ cell 42 in which the magnetization direction of the upper magnetic layer 42c is anti-parallel to that of the lower magnetic layer 42a. In this case, a net spin polarization current Inet passing through the MTJ cell 42 becomes at least the critical value Ic. Therefore, it is possible to reverse the magnetization direction of the upper magnetic layer 42c. However, in spite of the net spin polarization current Inet, the spin polarization direction of the spin polarization current is parallel to the magnetization direction of the upper magnetic layer 42c so that the magnetization direction of the upper magnetic layer 42c is not reversed. Consequently, in case of applying the predetermined spin polarization current (+Ic/2) corresponding to half of the critical value Ic to both the third and the fourth terminals 60 and 62 respectively, the initial polarization state of the MTJ cell 42 is not changed.

Referring to FIGS. 9 through 12, it is understood that an anti-parallel state of the MTJ cell 42 is not changed except the case of applying the predetermined spin polarization current (−Ic/2) corresponding to half of the critical value Ic to the first and the second terminals 50 and 52 respectively.

FIG. 13 is a table illustrating results obtained in the cases of FIGS. 9 through 12. In FIG. 13, AP represents an anti-parallel state of the MTJ cell 42 and P means a parallel state of the MTJ cell 42. In addition, numerals 1 and 0 have the same meanings as described above. Referring to FIG. 13, it is also understood that the MTJ cell 42 serves as an AND gate if the initial polarization state of the MTJ cell 42 is the anti-parallel state.

Figure 14:
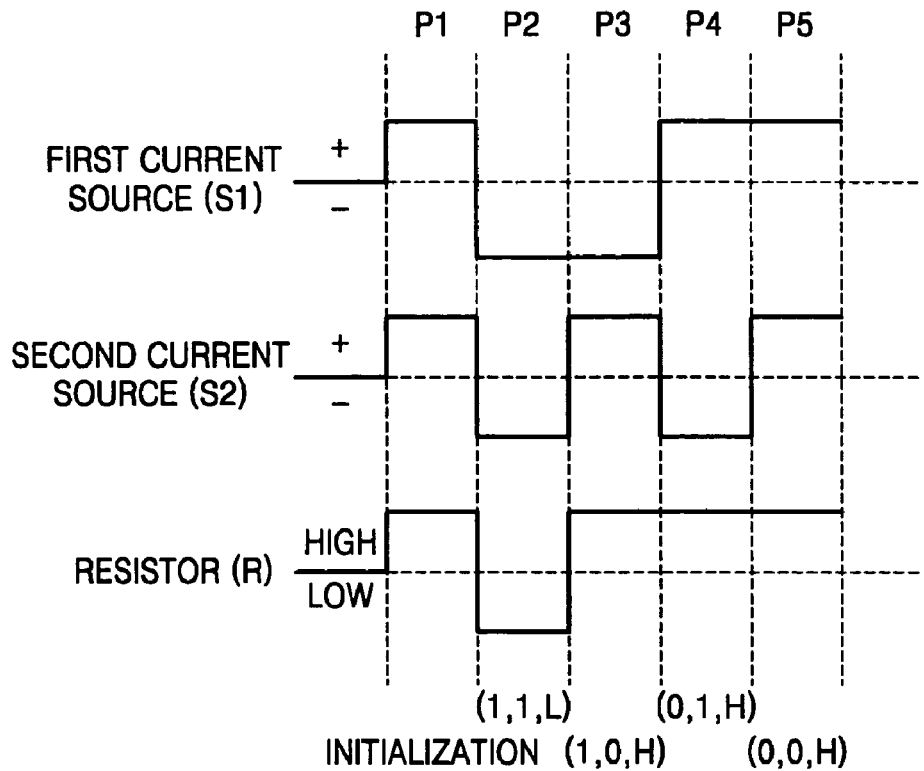
FIG. 14 is a timing diagram illustrating variations of current pulses applied to the MTJ cell from first and second current sources and variations in resistance when the MLD of FIG. 1 is used as an AND gate.

FIG. 14 is a timing diagram illustrating an operational mechanism of the MLD which is used as an AND gate according to an exemplary embodiment of the present invention.

Referring to FIG. 14, time-variant current pulses are shown that are applied to the MTJ cell 42 from each of the first and the second current sources, which are denoted as S1 and S2, respectively, in FIG. 2. Further, FIG. 14 shows a polarization state variance of the MTJ cell 42 according to the current variance. Herein, a current pulse during a first period P1 designates a current for making the MTJ cell 42 be in the anti-parallel polarization state at an initial point. A current pulse during a second period P2 represents each spin polarization current corresponding to −Ic/2 that is applied to the first and the second terminals 50 and 52. In addition, a current pulse during a third period P3 shows each spin polarization current corresponding to −Ic/2 and +Ic/2 that is applied to the first and the fourth terminals 50 and 62 respectively. Furthermore, a current pulse during a fourth period P4 is each spin polarization current corresponding to +Ic/2 and −Ic/2 that is applied to the third and the second terminals 60 and 52 respectively. Finally, a current pulse during a fifth period P5 designates each spin polarization current corresponding to +Ic/2 that is applied to the third and the fourth terminals 60 and 62, respectively.

From resistance variance of FIG. 14, it is understood that the resistance of the MTJ cell 42 is high except the second period P2. That is, only provided that the current pulse of −Ic/2 (i.e., the signal "1") is applied to both of the first and the second terminals 50 and 52 will the initial polarization state of the MTJ cell 42 be altered. Therefore, such a resistance variance describes the operation of the MLD used as an AND gate.

In FIG. 14, numerals 1 and 0 in parenthesis are related to a direction of the current pulse during each period, which is applied to the MTJ cell 42 as described above. In detail, numeral 1 designates the case in which the current pulse is applied to the MTJ cell 42 so that electrons flow from the lower magnetic layer 42a to the upper magnetic layer 42c. On the contrary, numeral 0 represents a case of a reverse flow direction. Moreover, H and L in round brackets respectively represent a case where the resistance of the MTJ cell 42 is high or low.

Hereinafter, the case where the MLD of FIG. 1 is used as an OR gate will be described as follows.

In this case, the magnetization direction of the upper magnetic layer 42c should be parallel to that of the lower magnetic layer 42a. In order to make the MTJ cell 42 exist in a parallel polarization state, a spin-polarized first current I1 having at least the critical value Ic is applied to the MTJ cell 42. This initializing procedure is depicted in FIG. 15.

FIGS. 16 through 19 are cross-sectional views illustrating the case where the MLD is used as an OR gate according to an exemplary embodiment of the present invention.

Figure 16:
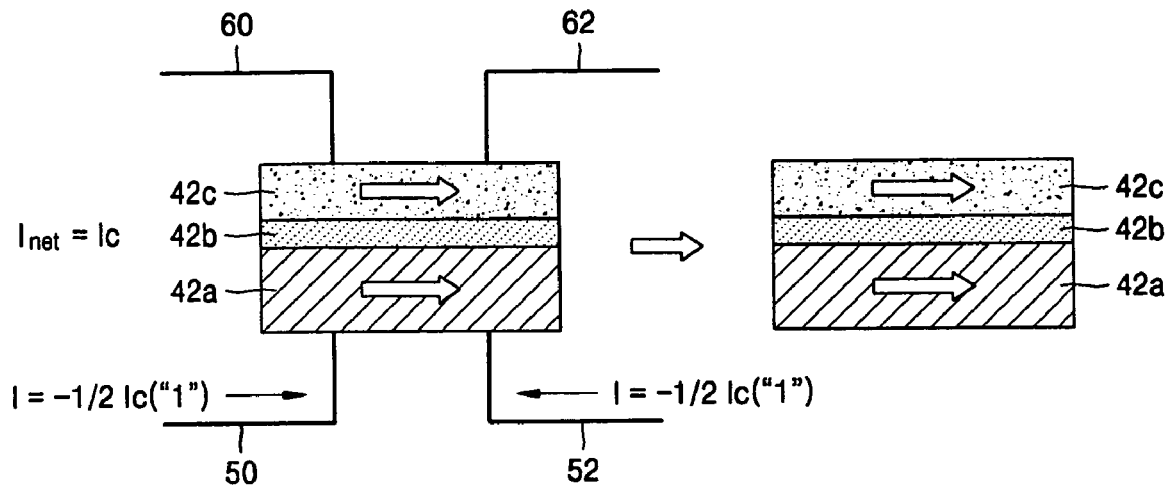
FIGS. 16 through 19 are cross-sectional views illustrating operations of the MLD of FIG. 1 when used as an OR gate.

First, referring to FIG. 16, if a predetermined current of −Ic/2 (i.e., a signal "1") is applied to each of the first and second terminals 50 and 52, a net current Inet applied to the MTJ cell 42 becomes the critical current capable of reversing the magnetization direction of the upper magnetic layer 42c. However, in this case, the magnetization direction of the upper magnetic layer 42c is not changed.

Figure 15:
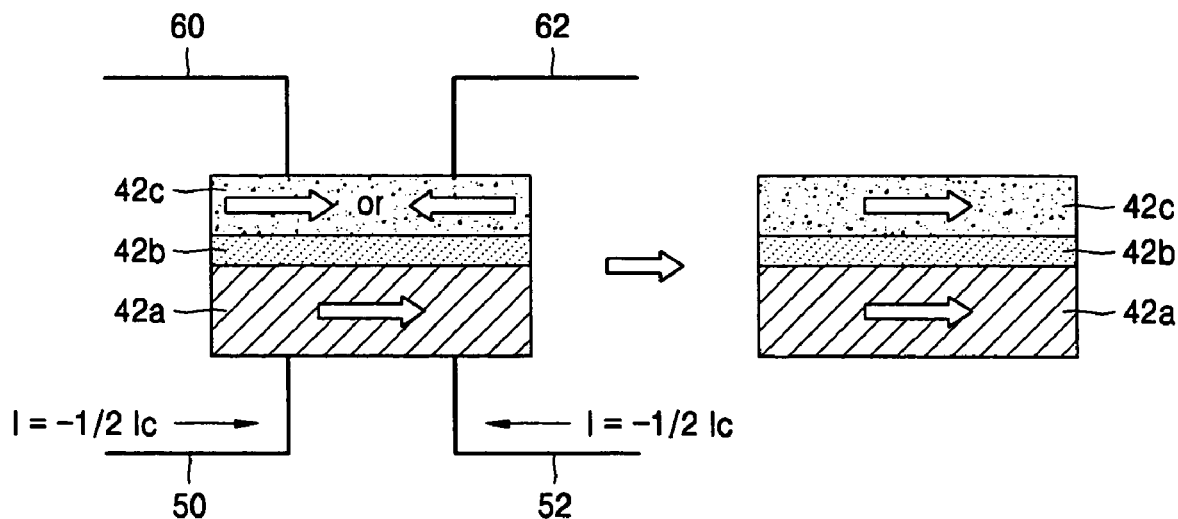
FIG. 15 is a cross-sectional view illustrating an initializing process for aligning a magnetization direction in the upper magnetic layer to be parallel to that in the lower magnetic layer in order to use the MLD of FIG. 1 as an OR gate.

In detail, a current of −Ic/2 that is applied to the MTJ cell 42 through the first and the second terminals 50 and 52 has a spin polarization direction parallel to the magnetization direction of the lower magnetic layer 42a soon after the current passes through the lower magnetic layer 42a, which has magnetization direction that is fixed to a predetermined direction, as shown in FIG. 15. However, if the MLD is used as an OR gate, the initial polarization state of the MTJ cell 42 is a parallel state. That is, the magnetization direction of the upper magnetic layer 42c is parallel to the magnetization direction of the lower magnetic layer 42a at the initial state. Therefore, although the net current Inet applied to the MTJ cell 42 reached to the critical current Ic capable of reversing the magnetization direction of the upper magnetic layer 42c, the spin polarization direction of the net current Inet applied to the MTJ cell 42 is parallel to the magnetization direction of the upper magnetic layer 42c so that the magnetization direction of the upper magnetic layer 42c is not reversed.

For this reason, when the current of −Ic/2 is applied to each of the first and the second terminals 50 and 52 respectively, the MTJ cell 42 maintains its initial polarization state.

Figure 17:
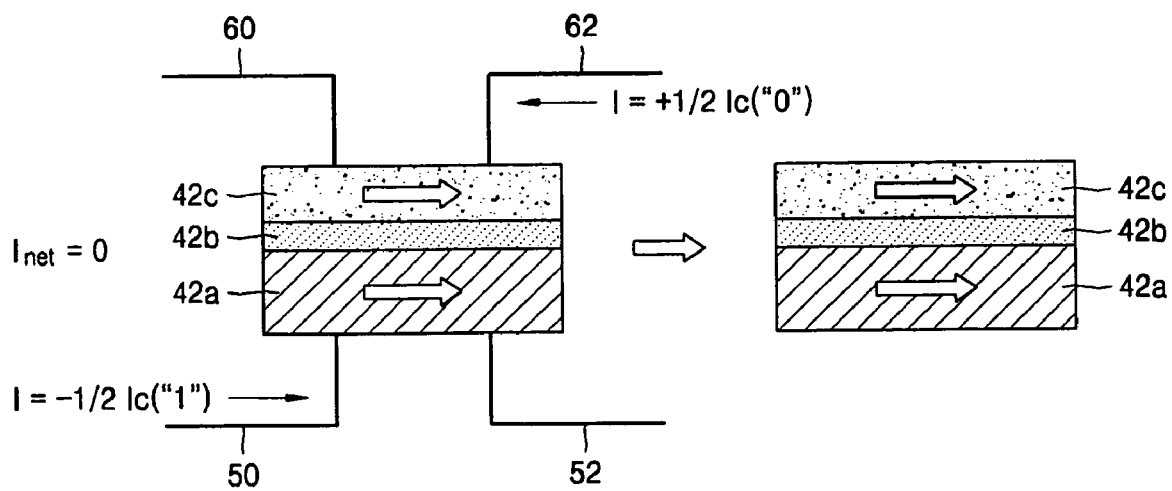

Referring to FIG. 17, in case that a predetermined current of −Ic/2 (i.e., the signal "1") is applied to the first terminal 50 and a predetermined current of +Ic/2 (i.e., the signal "0") is applied to the fourth terminal 62, a net current applied to the MTJ cell 42 is null regardless of the spin polarization of the current applied to the first and the fourth terminals 50 and 62. Accordingly, the magnetization direction of the upper magnetic layer 42c is not reversed so that the polarization state of the MTJ cell 42 remains as before.

Figure 18:
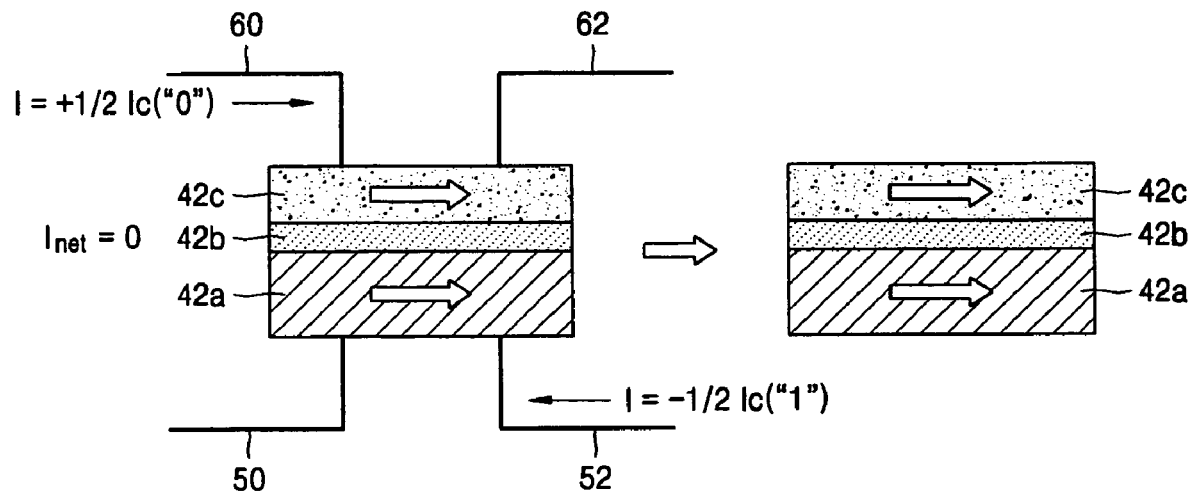

Referring to FIG. 18, in case that a predetermined current of −Ic/2 (i.e., the signal "1") is applied to the second terminal 52 and a predetermined current of +Ic/2 (i.e., the signal "0") is applied to the third terminal 60, a net current applied to the MTJ cell 42 is also null like FIG. 17. Therefore, the magnetization direction of the upper magnetic layer 42c is not reversed regardless of the spin polarization of the current applied to the second and the third terminals 52 and 60 so that the MTJ cell 42 keeps the initial parallel polarization state.

Figure 19:
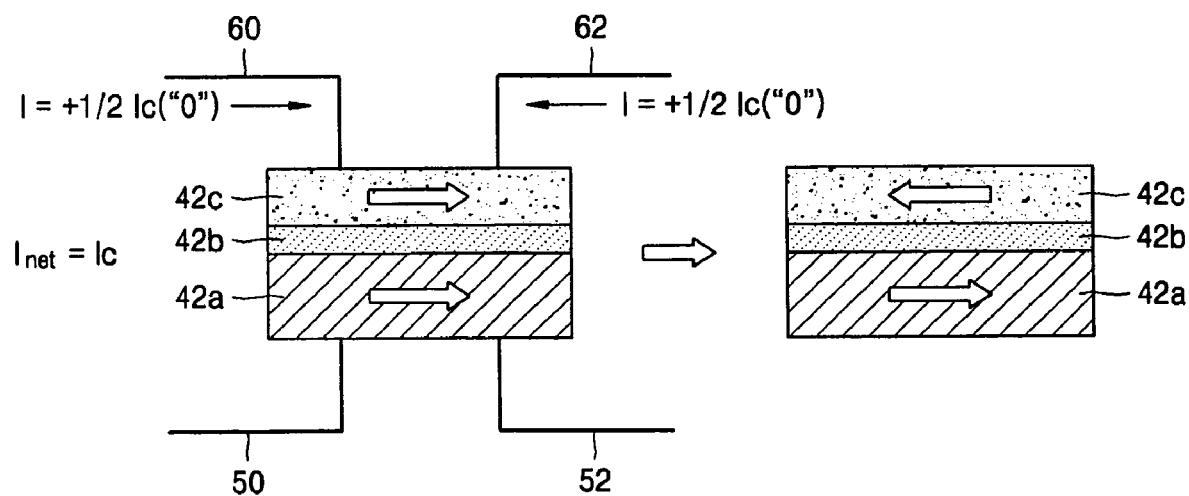

Referring to FIG. 19, provided that a predetermined current of +Ic/2 (i.e., the signal "0") is applied to both the third and the fourth terminals, a net current applied to the MTJ cell 42 becomes the critical current Ic. In addition, a major component of the predetermined current of +Ic/2 that is supplied through the third and the fourth terminals 60 and 62 is polarized in parallel with the magnetization direction of the upper magnetic layer 42c after passing through the upper magnetic layer 42c, whereas a minor component of the predetermined current +Ic/2 is polarized in anti-parallel with the magnetization direction of the upper magnetic layer 42c. However, the minor component of the predetermined current +Ic/2 having the opposite polarization direction with respect to the magnetization direction of the upper magnetic layer 42c is reflected at an interface between the non-magnetic layer 42b and the lower magnetic layer 42a into the upper magnetic layer 42c. The reflected minor component of the predetermined current results in reversing the magnetization direction of the upper magnetic layer 42c. As a result, the polarization state of the MTJ cell 42 becomes an anti-parallel state so that the magnetization direction of the upper magnetic layer 42c is opposite to that of the lower magnetic layer 42a, which causes a raise of the resistance of the MTJ cell 42 in comparison with the initial state of the MTJ cell 42.

Accordingly, only if the predetermined current of +Ic/2 (i.e., the signal "0") is applied to each of the third and the fourth terminals 60 and 62 under the condition that the initial state of the MTJ cell 42 is the parallel polarization state, the initial polarization state of the MTJ cell 42 is changed. Thus, the initial polarization state of the MTJ cell 42 is not changed at all except when +Ic/2 is applied to each of the third and fourth terminals.

Figures 20, 21:
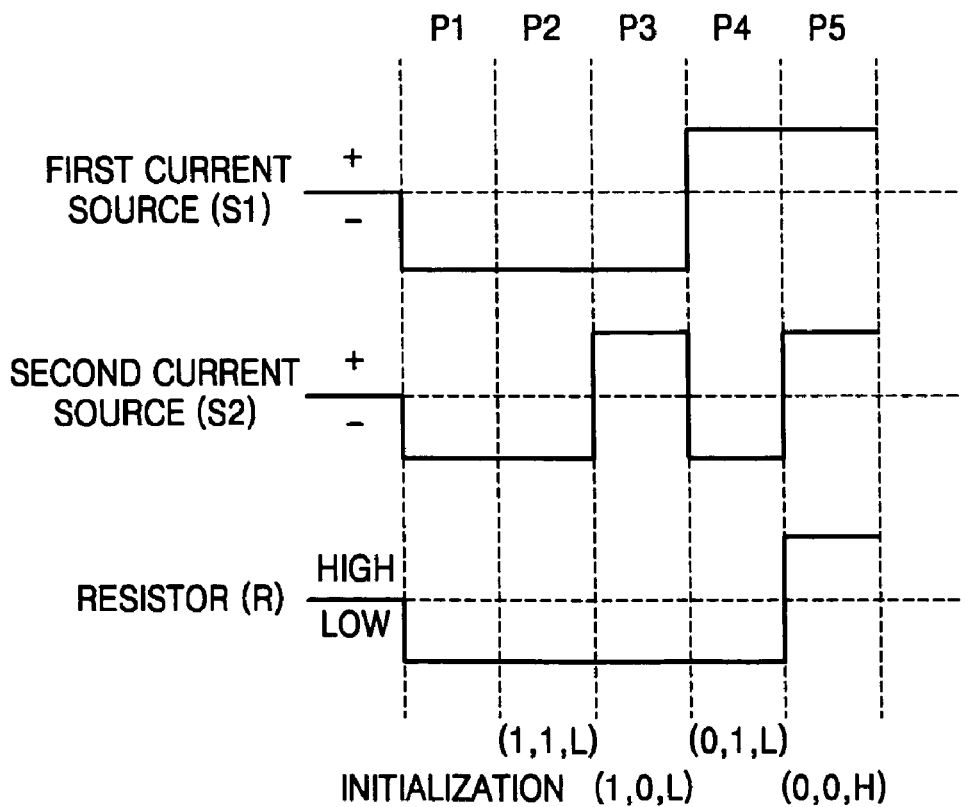
FIG. 20 is a table of the operations illustrated in FIGS. 16 through 19 when the MLD of FIG. 1 is used as an OR gate.
FIG. 21 is a timing diagram illustrating variations of current pulses applied to the MTJ cell from the first and second current sources and variations in resistance when the MLD of FIG. 1 is used as an OR gate.

FIG. 20 is a table illustrating results obtained in the cases of FIGS. 16 through 19. In FIG. 20, only if all the signals applied to the MTJ cell 42 are "0" under the condition that the initial state is the parallel state P, the initial polarization state of the MTJ cell 42 is changed to the anti-parallel state AP. In conclusion, it is understood that the MLD plays a role as an OR gate.

FIG. 21 is a timing diagram illustrating an operational mechanism of the MLD used as an OR gate according to an exemplary embodiment of the present invention.

Referring to FIG. 21, time-variant current pulses are shown that are applied to the MTJ cell 42 from each of the first and the second current sources S1 and S2, and further, a polarization state variance of the MTJ cell 42 according to the current variance is shown. Herein, a current pulse during a first period P1 designates a current for making the MTJ cell 42 have the parallel polarization state at an initial point. A current pulse during a second period P2 represents each current corresponding to −Ic/2 that is applied to the first and the second terminals 50 and 52. In addition, a current pulse during a third period P3 shows each current corresponding to −Ic/2 and +Ic/2 that is applied to the first and the fourth terminals 50 and 62, respectively. Furthermore, a current pulse during a fourth period P4 represents each spin polarization current corresponding to +Ic/2 and −Ic/2 that is applied to the third and the second terminals 60 and 52, respectively. Finally, a current pulse during a fifth period P5 designates each spin polarization current corresponding to +Ic/2 that is applied to the third and the fourth terminals 60 and 62, respectively.

As apparent from FIG. 21, the resistance of the MTJ cell 42 becomes high only within the fifth period P5. That is, only provided that each of the two signals that are applied to the MTJ cell 42 are "0", respectively, will the polarization state of the MTJ cell 42 be changed, which shows that the MLD performs the same operation of an OR gate.

In FIG. 21, numerals 1 and 0 and characters H and L in parenthesis have the same meanings as described with reference to FIG. 14.

Hereinafter, a method of manufacturing the MLD of FIG. 1 according to an exemplary embodiment of the present invention will be described with reference to the accompanying drawings.

FIGS. 22 through 25 are cross-sectional views and plane views illustrating a method of manufacturing the MLD used as an AND gate according to an exemplary embodiment of the present invention.

Figure 22:
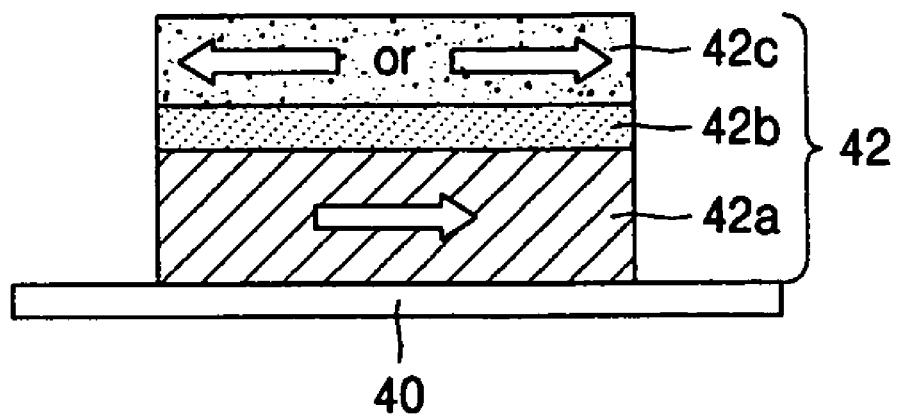
FIGS. 22, 23A, 24A and 25 are cross-sectional views illustrating a method of manufacturing an MLD shown in FIG. 1 when used as an AND gate.

Referring to FIG. 22, a lower magnetic layer 42a, a non-magnetic layer 42b and an upper magnetic layer 42c are sequentially formed on a predetermined location of a first interconnection 40, wherein the first interconnection 40 is a conductive interconnection made of, for example, a metallic material. A magnetization direction of the lower magnetic layer 42a is fixed in a predetermined orientation which is depicted as a white arrow in FIG. 22 and the lower magnetic layer 42a may be a multi-layered magnetic layer. The non-magnetic layer 42c is formed using a tunneling layer that has a predetermined thickness so that electrons flowing into the lower magnetic layer 42a or the upper magnetic layer 42c can penetrate therethrough by a tunneling effect. For example, the non-magnetic layer 42c may be an aluminum oxide (AlOx) layer. The upper magnetic layer 42c is formed using a predetermined magnetic substance having a characteristic that a magnetization direction may be easily changed according to a magnetic field of a predetermined intensity that is applied from the exterior, or a predetermined spin polarization current which penetrates therethrough.

Figure 23A:
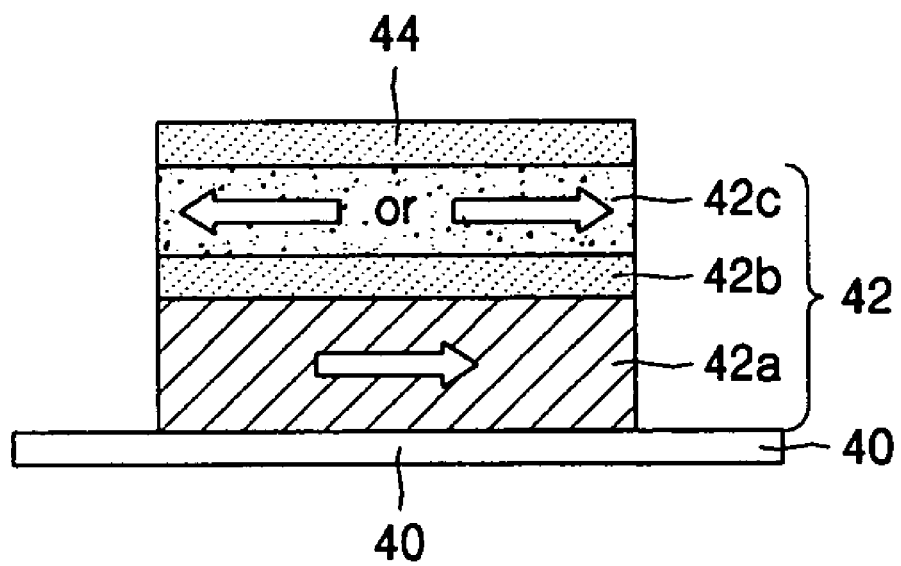
Figure 23B:
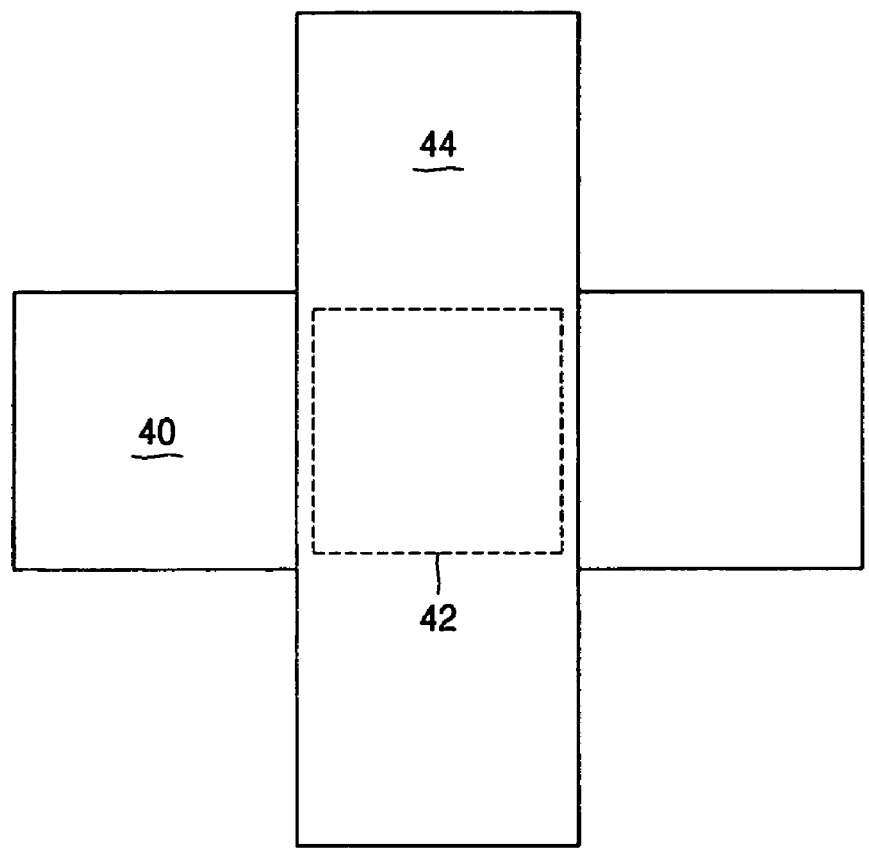
FIGS. 23B and 24B are plan views of the MLDs shown in FIGS. 23A and 24A, respectively.

Referring to FIG. 23A, a second interconnection 44 is subsequently formed on the upper magnetic layer 42c, wherein a width of the second interconnection 44 may be the same with that of the upper magnetic layer 42c. However, the width of the second interconnection 44 may be narrower than that of the upper magnetic layer 42c, if necessary. The second interconnection 44 is cross-linked to the first interconnection 40, as depicted in FIG. 23B, which is a plane view of FIG. 23A.

Figure 24A:
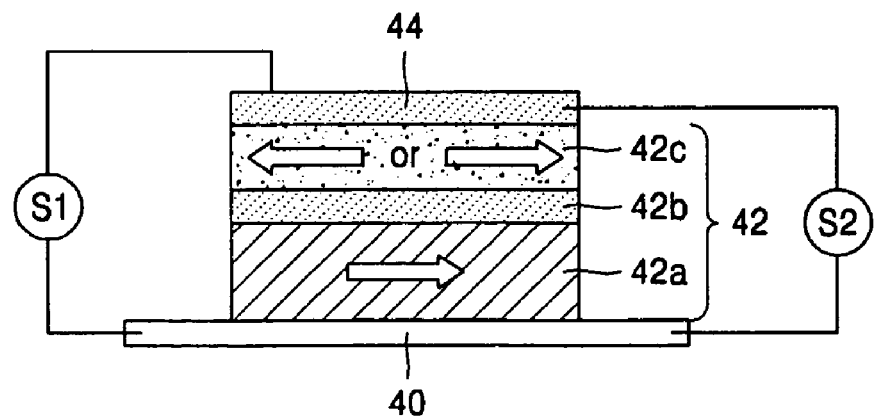
Figure 24B:
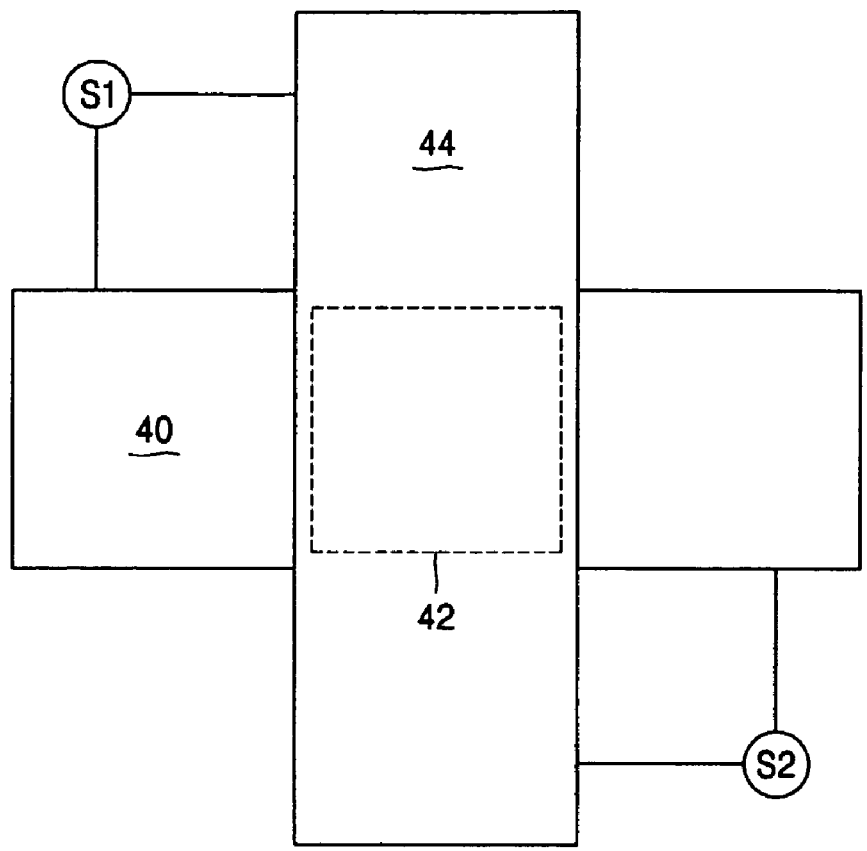

Thereafter, referring to FIGS. 24A and 24B, one end of the first interconnection 40 and one end of the second interconnection 44 are connected to a first current source S1. In addition, the other end of the first interconnection 40 and the other end of the second interconnection 44 are connected to a second current source S2.

Figure 25:
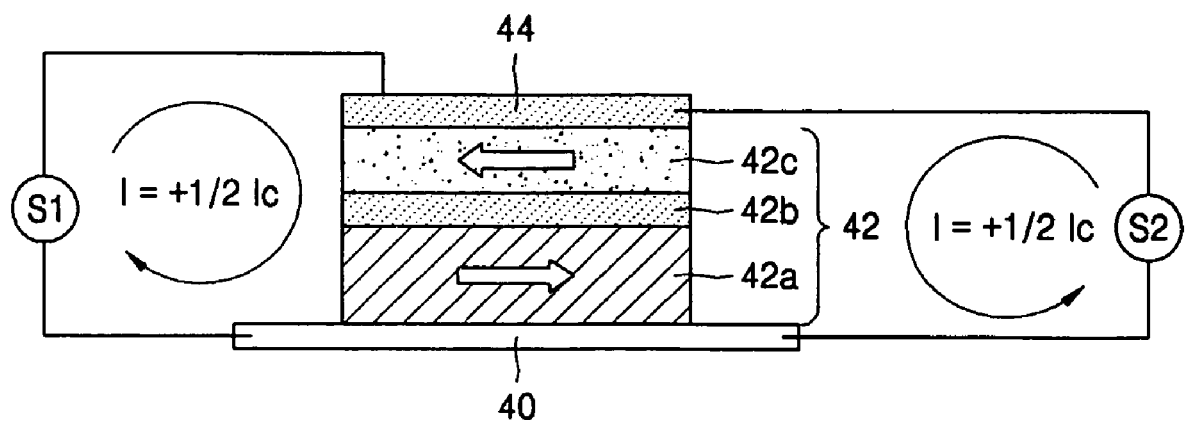

Subsequently, referring to FIG. 25, a predetermined current of +Ic/2 is applied by the first current source S1 so that the predetermined current of +Ic/2 flows from the upper magnetic layer 42c to the lower magnetic layer 42a between the first and the second interconnections 40 and 44. Coincidently, a predetermined current of +Ic/2 is applied by the second current source S2 so that the predetermined current of +Ic/2 flows from the upper magnetic layer 42c to the lower magnetic layer 42a between the first and the second interconnections 40 and 44. Due to the current applied by the first and the second current sources S1 and S2, the magnetization direction of the upper magnetic layer 42c is opposite to that of the lower magnetic layer 42a so that a polarization state of an MTJ cell 42 becomes an anti-parallel state. This completes the method of manufacturing the MLD for use as an AND gate.

Figure 26:
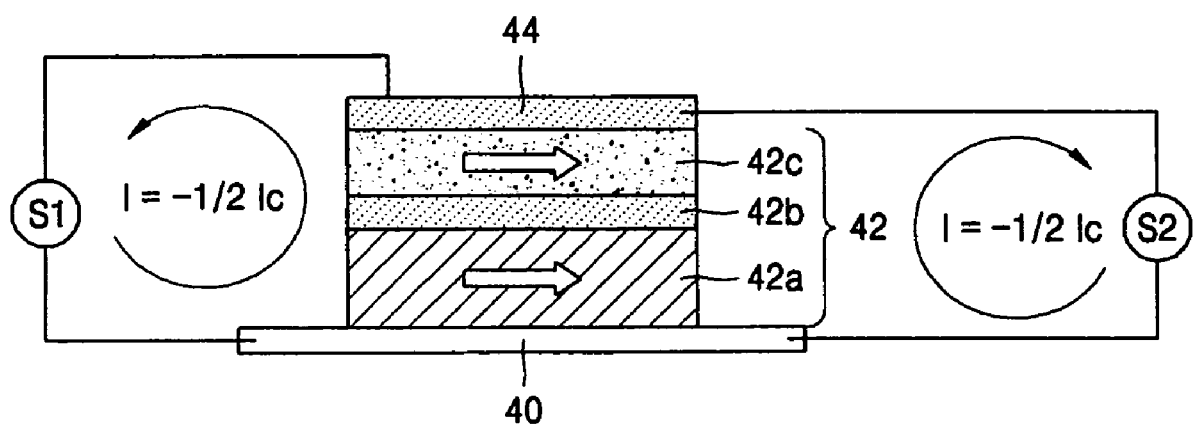

FIG. 26 is a cross-sectional view illustrating a method of manufacturing the MLD for use as an OR gate according to an exemplary embodiment of the present invention.

Referring to FIG. 26, since a process for forming the first interconnection 40, the second interconnection 44 and the MTJ cell 42, and a process for connecting the first and the second current sources S1 and S2 to the first and the second interconnections 40 and 44, are similar to those of the method of manufacturing the MLD for use as an AND gate, descriptions thereof will be omitted herein.

Thereafter, a predetermined current is applied by the first current source S1 so that the predetermined current flows from the lower magnetic layer 42a to the upper magnetic layer 42c between the first and the second interconnections 40 and 44. Simultaneously, a predetermined current is applied by the second current source S2 so that the predetermined current flows from the lower magnetic layer 42a to the upper magnetic layer 42c between the first and the second interconnections 40 and 44. Due to the current applied by the first and the second current sources S1 and S2, the magnetization direction of the upper magnetic layer 42c is aligned to be parallel to that of the lower magnetic layer 42a so that a polarization state of an MTJ cell 42 becomes a parallel state. This completes the method of manufacturing the MLD for use as an OR gate.

Thus, the MLD may be used as an AND gate or an OR gate according to an initial magnetization direction of the upper magnetic layer 42c. Since the magnetization direction of the upper magnetic layer 42c can be easily changed by the current that is applied by the first and the second current sources S1 and S2, it is possible to change an operational role or function of the MLD.

Meanwhile, although the magnetization direction of the upper magnetic layer 42c may be changed by the current supplied from the current source S1 and S2, the magnetization direction, in another exemplary embodiment, may be changed by using a predetermined magnetic field that is generated by an additional magnetic field generator prepared for using the MLD as an AND gate or an OR gate.

In addition, the current having a predetermined intensity which does not affect the magnetization direction of the upper magnetic layer 42c is applied to the MJT cell in a reading operation of the MLD so that it is possible to maintain a non-volatile state. Provided that the magnetization direction of the upper magnetic layer 42c is changed in the reading operation of the MLD, it is possible to maintain the non-volatile state through a refresh process.

As described above, the MLD of the present invention can be used as an AND gate or an OR gate by simply adjusting the magnetization direction of the upper magnetic layer of the MTJ cell. Therefore, the MLD may be selectively programmed according to a desired use. In addition, the MLD has a simple structure and it can be easily and simply manufactured. Furthermore, since the magnetization direction of the upper magnetic layer is not controlled by a magnetic field but by a spin-polarized current, it is possible to accurately control the magnetization direction of the upper magnetic layer by controlling the current applied to the MTJ cell. Moreover, the MLD according to an exemplary embodiment of the present invention can be implemented into only one cell, and thereby a highly integrated device can be obtained.

Although exemplary embodiments of the present invention have been described in detail, they should be considered in a descriptive sense only and not for purposes of limitation. For instance, those of ordinary skill in the art may modify the configuration of the MJT cell in which the upper magnetic layer 42c may be formed at a bottom face thereof and the lower magnetic layer 42a may be formed at a top face thereof Therefore, the scope of the invention is defined not by the detailed description of the invention but by the appended claims, and all differences within the scope will be construed as being included in the present invention.

What is claimed is:

1. An magnetic logic device (MLD) comprising:
   a first interconnection;
   a lower magnetic layer formed on the first interconnection, the lower magnetic layer having a magnetization direction that is fixed in a predetermined direction;
   a non-magnetic layer formed on the lower magnetic layer;
   an upper magnetic layer formed on the non-magnetic layer, the upper magnetic layer having a magnetization direction that is parallel or anti-parallel to the magnetization direction of the lower magnetic layer; and
   a second interconnection formed on the upper magnetic layer.

2. The MLD as claimed in claim 1, further comprising a first current source that is connected to a first end of the first interconnection and a first end of the second interconnection and a second current source that is connected to a second end of the first interconnection and a second end of the second interconnection.

3. The MLD as claimed in claim 1, wherein the lower magnetic layer includes a plurality of magnetic layers.

4. The MLD as claimed in claim 1, further comprising a capping layer that is disposed between the upper magnetic layer and the second interconnection.

5. The MLD as claimed in claim 1, wherein the non-magnetic layer formed on the lower magnetic layer includes one of a tunneling layer and a non-magnetic metal layer.

6. An magnetic logic device (MLD) comprising:
   a first interconnection;
   a lower magnetic layer formed on the first interconnection;
   a non-magnetic layer formed on the lower magnetic layer;
   an upper magnetic layer formed on the non-magnetic layer, the upper magnetic layer having a magnetization direction that is fixed in a predetermined direction; and
   a second interconnection formed on the upper magnetic layer,
   wherein a magnetization direction of the lower magnetic layer is parallel or anti-parallel to the magnetization direction of the upper magnetic layer.

7. The MLD as claimed in claim 6, further comprising a first current source that is connected to a first end of the first interconnection and a first end of the second interconnection and a second current source that is connected to a second end of the first interconnection and a second end of the second interconnection.

8. The MLD as claimed in claim 6, wherein the upper magnetic layer includes a plurality of magnetic layers.

9. The MLD as claimed in claim 6, further comprising a capping layer that is disposed between the upper magnetic layer and the second interconnection.

10. The MLD as claimed in claim 6, wherein the non-magnetic layer includes one of a tunneling layer and a non-magnetic metal layer.

11. A method of manufacturing a magnetic logic device (MLD), the method comprising:
    forming a lower magnetic layer on a first interconnection, the lower magnetic layer having a magnetization direction that is fixed in a predetermined direction;
    forming a non-magnetic layer on the lower magnetic layer and an upper magnetic layer on the non-magnetic layer;
    forming a second interconnection on the upper magnetic layer that is formed on the non-magnetic layer; and
    aligning a magnetization direction of the upper magnetic layer such that the magnetization direction of the upper magnetic layer is parallel or anti-parallel to the magnetization direction of the lower magnetic layer.

12. The method as claimed in claim 11, wherein a first end of the first interconnection and a first end of the second interconnection are connected to a first current source and a second end of the first interconnection and a second end of the second interconnection are connected to a second current source.

13. The method as claimed in claim 12, wherein the aligning the magnetization direction of the upper magnetic layer further comprises applying at least a current of Ic/2 to the first end of the first interconnection from the first current source and simultaneously applying at least a current of Ic/2 to the second end of the first interconnection from the second current source, where Ic is a critical current that is required to reverse the magnetization direction of the upper magnetic layer, such that the magnetization direction of the upper magnetic layer becomes parallel to the magnetization direction of the lower magnetic layer.

14. The method as claimed in claim 12, wherein the aligning of the magnetization direction of the upper magnetic layer further comprises applying at least a current of Ic/2 to the first end of the second interconnection from the first current source and simultaneously applying at least a current of Ic/2 to the second end of the second interconnection from the second current source, where Ic is a critical current that is required for reversing the magnetization direction of the upper magnetic layer, such that the magnetization direction of the upper magnetic layer becomes anti-parallel to the magnetization direction of the lower magnetic layer.

15. The method as claimed in claim 11, wherein the aligning of the magnetization direction of the upper magnetic layer further comprises applying a magnetic field of a predetermined intensity to the upper magnetic layer, such that the magnetization direction of the upper magnetic layer becomes parallel or anti-parallel to the magnetization direction of the lower magnetic layer.

16. The method as claimed in claim 11, wherein the non-magnetic layer is formed with one of a tunneling layer and a non-magnetic metal layer.

17. A method of manufacturing a magnetic logic device (MLD), the method comprising:
    forming a lower magnetic layer on a first interconnection and a non-magnetic layer on the lower magnetic layer;
    forming an upper magnetic layer on the non-magnetic layer, the upper magnetic layer having a magnetization direction that is fixed in a predetermined direction;
    forming a second interconnection on the upper magnetic layer that is formed on the non-magnetic layer; and
    aligning a magnetization direction of the lower magnetic layer such that the magnetization direction of the upper magnetic layer is parallel or anti-parallel to the magnetization direction of the upper magnetic layer.

18. The method as claimed in claim 17, wherein a first end of the first interconnection and a first end of the second interconnection are connected to a first current source and a second end of the first interconnection and a second end of the second interconnection are connected to a second current source.

19. The method as claimed in claim 18, wherein the aligning the magnetization direction of the lower magnetic layer further comprises applying at least a current of Ic/2 to the first end of the first interconnection from the first current source and simultaneously applying at least a current of Ic/2 to the second end of the first interconnection from the second current source, where Ic is a critical current that is required to reverse the magnetization direction of the lower magnetic layer, such that the magnetization direction of the lower magnetic layer becomes anti-parallel to the magnetization direction of the upper magnetic layer.

20. The method as claimed in claim 18, wherein the aligning the magnetization direction of the lower magnetic layer further comprises applying at least a current of Ic/2 to the first end of the second interconnection from the first current source and simultaneously applying at least a current of Ic/2 to the second end of the second interconnection from the second current source, where Ic is a critical current that is required to reverse the magnetization direction of the lower magnetic layer, such that the magnetization direction of the lower magnetic layer becomes parallel to the magnetization direction of the upper magnetic layer.

21. The method as claimed in claim 17, wherein the aligning the magnetization direction of the lower magnetic layer further comprises applying a magnetic field of a predetermined intensity to the lower magnetic layer, such that the magnetization direction of the lower magnetic layer becomes parallel or anti-parallel relative to the magnetization direction of the upper magnetic layer.

22. The method as claimed in claim 17, wherein the non-magnetic layer is formed with one of a tunneling layer and a non-magnetic metal layer.

23. A method of operating an MLD (magnetic logic device) including a first interconnection, a lower magnetic layer formed on the first interconnection, the lower magnetic layer having a magnetization direction that is fixed in a predetermined direction, a non-magnetic layer formed on the lower magnetic layer, an upper magnetic layer formed on the non-magnetic layer, the upper magnetic layer having a magnetization direction parallel or anti-parallel relative to the magnetization direction of the lower magnetic layer, and a second interconnection formed on the upper magnetic layer, the method comprising:
    applying at least a current of Ic/2 to two terminals selected among a first to a fourth terminals, wherein a first end and a second end of the first interconnection correspond to the first terminal and the second terminal, respectively, and a first end and a second end of the second interconnection correspond to the third terminal and the fourth terminal, respectively, where Ic is a critical current that is required to reverse the magnetization direction of the upper magnetic layer.

24. The method as claimed in claim 23, wherein the non-magnetic layer includes one of a tunneling layer and a non-magnetic metal layer.

25. A method of operating an MLD (magnetic logic device) including a first interconnection, a lower magnetic layer, a non-magnetic layer and formed on the first interconnection, an upper magnetic layer formed on the non-magnetic layer, and a second interconnection formed on the upper magnetic layer, the lower magnetic layer having a magnetization direction that is parallel or anti-parallel relative to a magnetization direction of the upper magnetic layer, which is fixed in a predetermined direction, the method comprising:

applying at least a current of Ic/2 to two terminals selected among a first to a fourth terminals, wherein a first end and a second end of the first interconnection correspond to the first terminal and the second terminal, respectively, and a first end and a second end of the second interconnection correspond to the third terminal and the fourth terminal, respectively, where Ic is a critical current that is required to reverse the magnetization direction of the lower magnetic layer.

26. The method as claimed in claim 25, wherein the non-magnetic layer includes one of a tunneling layer and a non-magnetic metal layer.

* * * * *